(12) United States Patent
Nitta

(10) Patent No.: US 6,807,201 B1
(45) Date of Patent: Oct. 19, 2004

(54) LASER WITH PHASE CONTROLLING REGION AND METHOD FOR DRIVING THE SAME

(75) Inventor: Jun Nitta, Ninomiya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/267,362

(22) Filed: Mar. 15, 1999

(30) Foreign Application Priority Data

Mar. 19, 1998 (JP) ............................. 10-090991

(51) Int. Cl.[7] ............................. H01S 3/10; H01S 3/13; H01S 5/00; H01S 3/08
(52) U.S. Cl. ...................... 372/29.02; 372/26; 372/27; 372/29.023; 372/49; 372/43; 372/50; 372/102
(58) Field of Search ....................... 372/50, 27, 29.023, 372/43, 44, 96, 26, 29.02, 49, 54, 99, 102, 97

(56) References Cited

U.S. PATENT DOCUMENTS

| | | | |
|---|---|---|---|
| 5,471,335 A | 11/1995 | Nitta | 359/179 |
| 5,606,176 A | 2/1997 | Nitta | 257/18 |
| 5,757,840 A * | 5/1998 | Hiroki | 372/96 |
| 5,848,085 A | 12/1998 | Nitta | 372/45 |
| 5,901,166 A | 5/1999 | Nitta et al. | 372/50 |
| 5,926,497 A | 7/1999 | Nitta et al. | 372/96 |

FOREIGN PATENT DOCUMENTS

| JP | 07-162088 | 6/1995 |
|---|---|---|
| JP | 08-172234 | 7/1996 |

* cited by examiner

Primary Examiner—Minsun Oh Harvey
Assistant Examiner—Armando Rodriguez
(74) Attorney, Agent, or Firm—Fitzpatrick, Cella, Harper & Scinto

(57) ABSTRACT

A laser includes a first region with a first moveguide having a first diffraction grating, a second region with a second waveguide having a second diffraction grating, and a phase controlling region with a third waveguide and a phase control unit for controlling an effective refractive index of the third waveguide. The phase controlling region, the first region and the second region are coupled serially along a light propagation direction in this order, and are constructed such that light to the first region from the phase controlling region is enlarged relatively to light to the phase controlling region from the first region, or constructed such that a coupling coefficient of the first diffraction grating in the first region adjacent to the phase controlling region is smaller than a coupling coefficient of the second diffraction grating in the second region away from the phase controlling region.

13 Claims, 5 Drawing Sheets

140# LASER WITH PHASE CONTROLLING REGION AND METHOD FOR DRIVING THE SAME

BACKGROUND OF THE INVENTION

1. Field of the Invention

The present invention relates to a laser, such as a distributed feedback (DFB) semiconductor laser capable of switching a polarization mode of its output light between two polarization modes (typically, transverse electric (TE) mode and transverse electric (TM) mode) depending on its driven condition, and relates to a method of driving that laser and to an apparatus or system including the laser.

2. Related Background Art

Conventionally, Japanese Patent Application Laid-Open No. 7(1995)-162088, for example, discloses a polarization-mode switchable DFB semiconductor laser with plural electrodes in which the relation between a wavelength dispersion of a gain created by its active layer and a Bragg wavelength determined from a pitch of its diffraction grating and so forth, is controlled.

FIG. 1 illustrates a conventional structure of such a type. FIG. 1 is a cross-sectional view taken along a laser resonance (cavity-axial) direction of the DFB semiconductor laser. The structure includes a lower clad layer 1010, an active layer 1011, a light guide layer 1012, an upper clad layer 1013, and a contact layer 1014 which are laid down over a substrate 1009, in this order. A diffraction grating 1020 is formed at the interface between the light guide layer 1012 and the upper clad layer 1013. The contact layer 1014 is divided into two portions along the resonance direction. Electrodes 1002 and 1003 are respectively deposited on the two portions of the contact layer 1014, and an electrode 1008 is formed on the bottom surface of the substrate 1009. Currents can be independently injected into two active regions under the electrodes 1002 and 1003, which are electrically independent from each other along the laser resonance direction. An antireflection layer 1004 is provided on an end facet of the laser, and a separating groove 1015 is formed between the two active regions.

In the conventional structure, the active layer 1011 is formed of a quantum well structure of AlGaAs and GaAs. The Bragg wavelength of the grating 1020 is set at a value shorter than a peak wavelength of the gain spectrum for the TE mode. Thus, a polarization mode contention condition can be created between the TE mode and the TM mode. A ratio between the currents injected into the two active regions can be controlled, so that the polarization mode of its oscillated output light can be switched between the TE mode and the TM mode.

Further, Japanese Patent Application Laid-Open No. 2(1990)-159781 discloses a three-electrode DFB semiconductor laser with a λ/4 phase shift section in its diffraction grating, which can switch the polarization mode of its output light between the TE mode and the TM mode. The semiconductor laser includes a structure in which currents can be independently injected into a region with the λ/4 phase shift and a region without it. The λ/4 phase shift section is formed in a central portion, and currents can be independently injected into the central portion and two remaining portions on both opposite sides thereof. When the current injected into the central region with the λ/4 phase shift is changed under a uniform current injection condition, the oscillation polarization mode can be switched between the TE mode and the TM mode.

Furthermore, Japanese Patent Application Laid-Open No. 8(1996)-172234 discloses a polarization-mode switchable semiconductor laser with a phase controlling or adjusting region lacking a diffraction grating and an active layer, in which a difference of about π is generated between phase changes for the TE mode and the TM mode in the phase controlling region. The polarization dependency of the amount of the phase change is thus set such that the oscillation polarization mode can be stably switched.

Each of the above structures effects the polarization switching when its light circulation phase is changed. Further, each has a structure satisfying the following condition: While the mode is being changed to a mode whose circulation phase differs from the present mode by 2π, for the same polarization mode (for example, TE mode), the circulation phase of light in the other polarization mode (for example, TM mode) comes to satisfy the resonance condition and the pumping amount comes to reach its threshold gain. For this purpose, a strained quantum well is used in the conventional structure, for example. This approach can also be used in the present invention.

However, in the conventional polarization-mode switchable DFB laser with the phase adjusting region wherein a diffraction grating region and a phase adjusting region are arranged serially, a sufficient effect of light adjusted in the phase adjusting region often cannot be obtained when light is only weakly returned from the phase adjusting region, or when the coupling coefficient of the diffraction grating is large and thus its reflection factor is high.

SUMMARY OF THE INVENTION

It is an object of the present invention to provide a laser, such as a distributed feedback semiconductor laser, which is constructed such that light influenced by its phase controlling or adjusting region can readily influence a region adjacent to the phase controlling region effectively, and to a driving method for driving the laser, a light transmitter using the laser, and an optical transmission system or method using the laser.

The object of the present invention is achieved by the following lasers, driving methods, transmitters and optical communication systems or methods.

A laser of this invention includes a first region with a first waveguide having a first diffraction grating, and a second region wave waveguide having a second diffraction grating, and a phase controlling region with a third waveguide and a phase control unit for controlling an effective refractive index of the third waveguide. The phase controlling region, the first region and the second region are serially coupled along a light propagation direction in this order, and are constructed such that light to the first region from the phase controlling region is enlarged relatively to light to the phase controlling region from the first region, or constructed such that a coupling coeffecient of the first diffraction grating in the first region adjacent to the phase controlling region is smaller than a coupling coefficient of the second diffraction grating in the second region.

The effect or performance of the phase controlling region is enhanced, and hence the modulation of polarization-mode or wavelength can be effectively achieved stably. Further, the action of the phase controlling region can be effectively employed by making the coupling coefficient in the first region adjacent to the phase controlling region smaller than the coupling coefficient in the second region away from the phase controlling region, though the coupling coefficient of the region other than the phase controlling region is not decreased uniformly.

More specifically, the following structures may be adopted based on the above fundamental structures.

A coupling coefficient of the first diffraction grating in the first region adjacent to the phase controlling region may be set smaller than a coupling coefficient of the second diffraction grating in the second region. In this structure, the grating region with the smaller coupling coefficient allows a large change of light at a wavelength at which phases of light travelling from the phase controlling region and light reflected in the grating region with the smaller coupling coefficient coincide with each other, by the control of the phase of light in the phase controlling region. Accordingly, a resonance wavelength balancing in three regions of the regions with large and small coupling coefficients and the phase controlling region can be largely changed by the change of the index in the phase controlling region due to the control of current injection, voltage application or the like. As a result, the effect of the phase controlling region can be enhanced, and hence the modulation of polarization mode or wavelength can be effectively and stably achieved. The feature of this structure is that the grating region is devised such that light influenced by the phase controlling region can readily influence the grating region adjacent to the phase controlling region.

Further, the following specific structures may be used as a structure for making light to the first region from the phase controlling region larger than light to the phase controlling region from the first region.

The first region includes a first control unit for pumping the first region, and the phase control unit and the first control unit are capable of independently controlling the phase controlling region and the first region, respectively. In this structure, a feedback function of the region adjacent to the phase controlling region is weakened relatively to that of the other region, so that the influence of light from the phase controlling region can be readily increased. As a result, the effect of the phase controlling region can be enhanced, and hence the modulation of polarization mode or wavelength can be effectively and stably achieved. The feature of the structure is that a feedback to the region adjacent to the phase controlling region due to the gain can be decreased.

The laser may be typically constructed as a distributed feedback semiconductor laser. In this case, the phase controlling region may include a cleaved end facet. A reflective layer may be provided on the cleaved end facet. In this structure, the end facet with a large reflection factor can be used, different from a case where the phase controlling region is arranged near a central portion of the DFB laser, and thus the effect of the phase controlling region can be further increased.

According to still another aspect of the present invention, there is provided a method for driving a laser in which a current injected into or a reverse voltage applied to the phase controlling region is changed to change at least one of a polarization mode and a waveguide of light output from the laser.

According to still another aspect of the present invention, there is provided a light transmitter which includes the above laser, a control unit for controlling light output from the laser in accordance with a transmission signal, and a mode selector for selecting a component of a desired mode from the light output from the laser. The mode selector may be a polarization-mode selector or a wavelength selector.

According to still another aspect of the present invention, there is provided an optical communication system for communicating over a light transmission line that transmits a signal from a transmitter side to a receiver side, in which light of a signal from the above transmitter is transmitted through the light transmission line, and a receiver receives and detects an intensity-modulated signal transmitted from the transmitter through the light transmission line. The system may be a wavelength division multiplexing optical communication system, in which a light transmission line transmits a plurality of intensity-modulated signals at a plurality of wavelengths generated by a plurality of the above transmitters, and a wavelength selector, such as a tunable band-pass filter, selects the intensity-modulated signal at a desired wavelength to be detected on a receiver side.

These advantages and others will be more readily understood in connection with the following detailed description of the preferred embodiments in conjunction with the drawings.

DESCRIPTION OF THE PREFERRED EMBODIMENTS

First Embodiment

Figure 1:
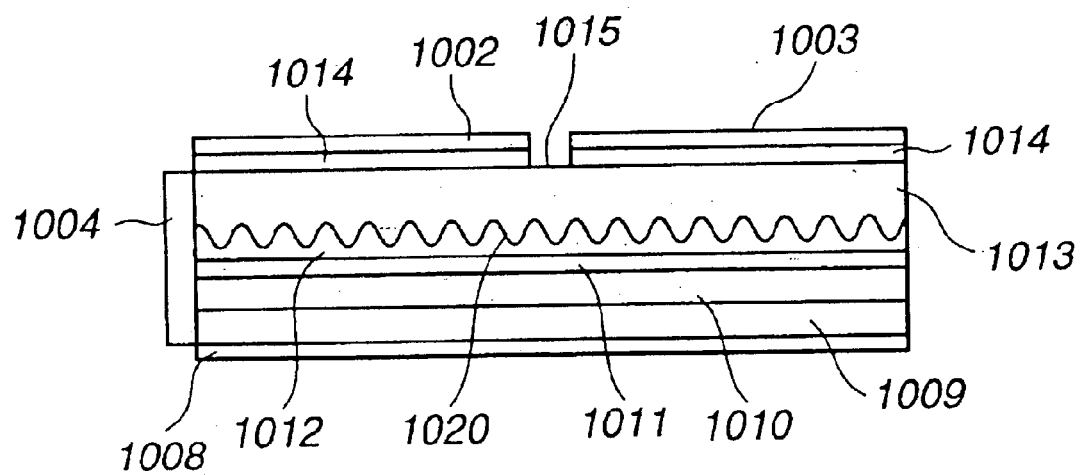
FIG. 1 is a cross-sectional view illustrating a conventional DFB semiconductor laser.
Figure 2:
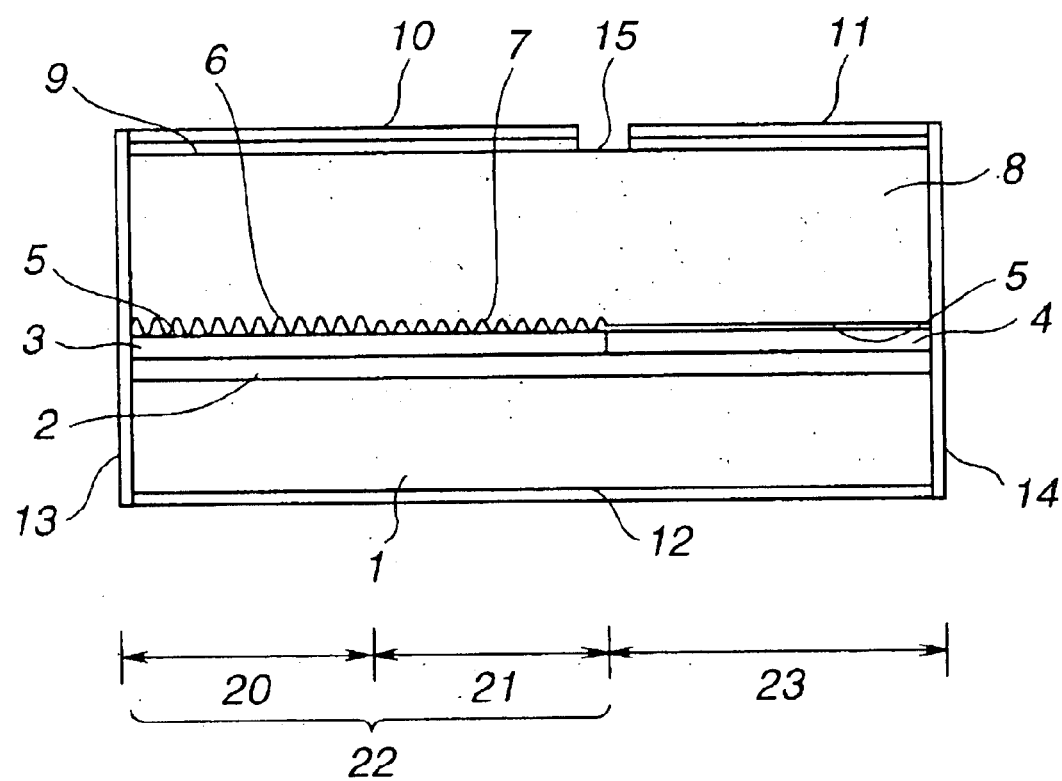
FIG. 2 is a cross-sectional view illustrating a first embodiment of the present invention, which is a DFB semiconductor laser, taken along its cavity-axial direction.

A first embodiment of a DFB semiconductor laser is illustrated in FIG. 2. As illustrated in FIG. 2, a buffer layer 2 of n-InP, an active layer 3, a refractive-index controlling layer 4, a light guide layer 5 of undoped InGaAsP, a clad layer 8 of p-InP, and a contact layer 9 of p-InGaAs are laid down over a substrate 1 of n-InP in this order. First and second diffraction gratings 6 and 7 are formed at the interface between the light guide layer 5 and the clad layer 8. Further, first and second electrodes 10 and 11 are deposited on divided portions of the contact layer 9, and a third electrode 12 is formed on the bottom surface of the substrate 1. An antireflection layer 13 is provided on an end facet of a region with the first and second gratings 6 and 7 of the laser, and a reflective layer 14 is formed on an end facet of a region lacking the grating. A separating groove 15 is formed between the first and second electrodes 10 and 11 for the purpose of electric separation.

In the above structure, a region under the first electrode 10 is a DFB laser region 22, and a region under the second electrode 11 is a phase controlling or adjusting region 23. In the DFB laser region 22, there are arranged a high-κ region 20 corresponding to a portion with the first diffraction grating 6 having a relatively large coupling coefficient κ and a low-κ region 21 corresponding to a portion with the second diffraction grating 7 having a relatively small coupling coefficient κ. The positional relation between those four regions 20–23 is indicated in FIG. 2.

Figure 3:
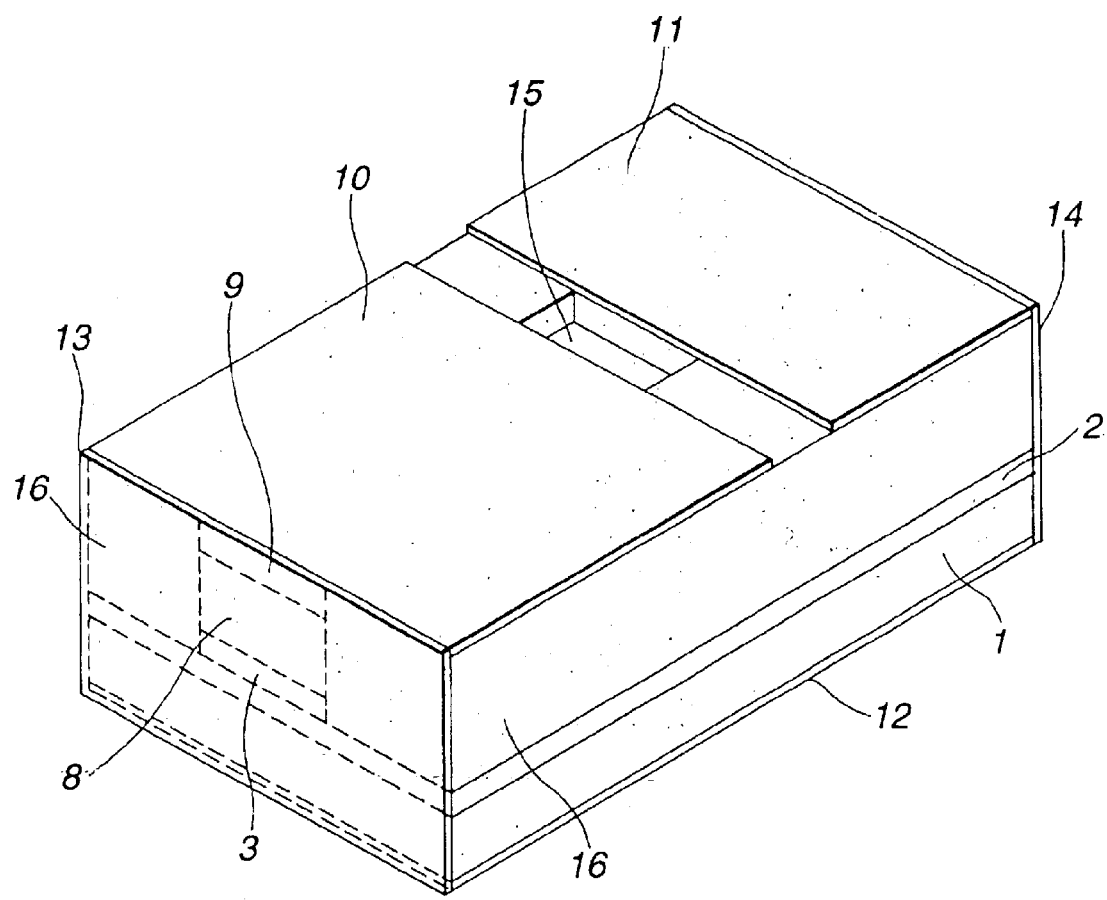
FIG. 3 is a perspective view illustrating the first embodiment.

FIG. 3 illustrates a perspective view of the first embodiment. As illustrated in FIG. 3, a burying structure of burying layers 16 is employed as a confining structure in a direction transverse to a light propagation direction. The burying layer 16 may be a high-resistance layer, a p-n burying layer, or the like. The waveguide structure of the laser is not limited to the illustrated one, but any structure, such as a ridge type and an electrode-stripe type, can be used provided that it can be used in the semiconductor laser.

The phase adjusting region 23 is coupled to the low-κ region 21 with the second grating 7 in the DFB laser region 22. Pitches of the first and second gratings 6 and 7 are set to a common value of 243 nm, while depths thereof are varied such that the first and second gratings 6 and 7 can have the above coupling coefficients. Specifically, the larger coupling coefficient of the first grating 6 is approximately set to 80 cm$^{-1}$, while the smaller coupling coefficient of the second grating 6 is approximately set to 30 cm$^{-1}$. The longitudinal length of each of the high- and low-κ regions 20 and 21 is set to 200 µm, and the length of the phase adjusting region 23 is set to 150 µm.

The reflective layer 14 is formed on the end facet of the phase adjusting region 23 to enhance the effect of the phase adjusting region. The antireflection layer 13 is formed on the end facet of the high-κ region 20 so that an inherent operation of the DFB laser region 22 can be secured. Influences of variation are eliminated among end facets of the first diffraction gratings 6 of individual devices, which variation is due to the process of cleaving the device.

The active layer 3 has approximately the same amplification factor for the TE-mode light and the TM-mode light propagating along the waveguide. In this embodiment, a 0.6%-tensile-strained quantum well layer is used as the active layer 3 to achieve a desired characteristic for light at a wavelength of about 1.55 µm. The quantum well layer has a well width of 13 nm, a barrier width of 10 nm, and a barrier-composition wavelength of 1.17 µm. The index controlling layer 4 is formed of material whose bandgap wavelength is set to about 50 nm shorter than the wavelength of light oscillated in the DFB laser region 22.

The operation of the first embodiment will be described. When a forward bias is applied across the first electrode 10 and the third electrode 12, oscillation of the DFB laser occurs above a certain current amount. In this case, the circulation phase of light oscillated in the cavity satisfies the oscillation condition. Here, the circulation phase is a phase shift that the light shows when the light circulates once in the cavity. In this state, when a current is injected into the phase adjusting region 23 across the second and third electrodes 11 and 12 to change the effective refractive index of the waveguide in this region 23, the phase will be changed in light reflected by the reflective layer 14 and returning to the DFB laser region 22. As a result, the oscillation wavelength prior to the current injection into the region 23 comes to deviate from the circulation-phase condition and light thereat ceases. Thus, the oscillation mode turns to another wavelength or polarization mode that satisfies the circulation-phase condition.

A change of the refractive index in the phase adjusting region 23 occurs for each of the TE mode and the TM mode. Accordingly, when the polarization dependency of the gain in the active layer 3 is adjusted such that thresholds contend between those polarization modes, the polarization mode of output light can be switched. In this embodiment, the index controlling layer 4 is composed of material transparent to light amplified in the active layer 3. The index controlling layer 4 may also be formed of material whose refractive index can be changed due to quantum confinement Stark effect (QCSE), Frantz-Keldysh effect or the like when a reverse voltage is applied thereto, since the layer 4 only needs to have a function for changing the phase of light propagating through the phase adjusting region 23. Further, where the index controlling layer 4 is formed of material whose index can be changed when a current is injected thereinto, a laser operates similarly to this embodiment even if the material absorbs or amplifies the oscillated light, though its performance is slightly lowered.

In the above device, the coupling coefficient of the second diffraction grating 7 is lowered, and the reflective layer 14 is formed on the end facet. Hence, light returning from the phase adjusting region 23 is strengthened relatively to light from the low-κ region 21, so that the influence of the light returning from the region 23 is increased. Consequently, the oscillation mode can be efficiently and stably modulated by the control of the phase adjusting region 23.

Second Embodiment

Figure 4:
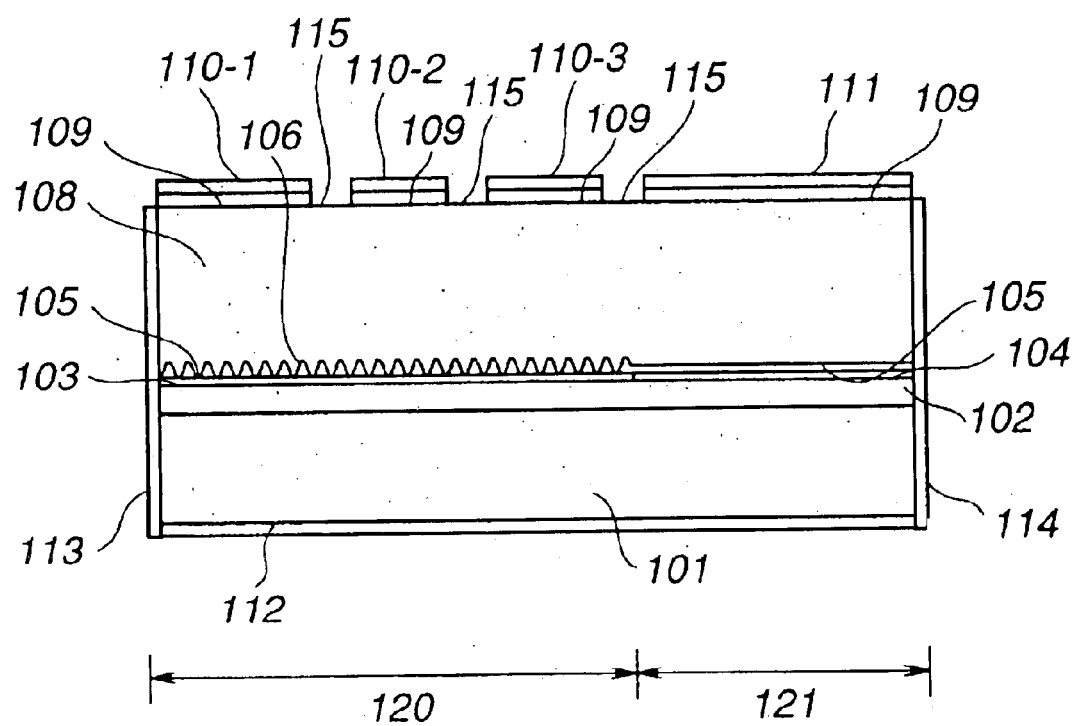
FIG. 4 is a cross-sectional view illustrating a second embodiment of the present invention, which is a DFB semiconductor laser, taken along its cavity-axial direction.

A second embodiment of a DFB semiconductor laser is illustrated in FIG. 4. As illustrated in FIG. 4, a buffer layer 102 of n-InP, an active layer 103, a refractive-index controlling layer 104, a light guide layer 105 of undoped InGaAsP, a clad layer 108 of p-InP, and a contact layer 109 of p-InGaAs are laid down over a substrate 101 of n-InP in this order. A diffraction grating 106 is formed at the interface between the light guide layer 105 and the clad layer 108 in a DFB laser region 120. Further, a set of three first electrodes 110-1, 110-2 and 110-3 and a second electrode 111 are deposited on divided portions of the contact layer 109, and a third electrode 112 is formed on the bottom surface of the substrate 101. An antireflection layer 113 is provided on an end facet of the DFB laser region 120 with the grating 106 in the laser, and a reflective layer 114 is formed on an end facet of a phase adjusting region 121 lacking the grating. Separating grooves 115 are respectively formed between the three first electrodes 110-1, 110-2 and 110-3 and the second electrode 111 for the purpose of electric separation.

In the above structure, a region under the first three electrodes 110-1, 110-2 and 110-3 is the DFB laser region 120, and a region under the second electrode 111 is the phase adjusting region 121. The positional relation between those two regions 120 and 121 is indicated in FIG. 4. Also in this embodiment, a burying structure of burying layers is employed as a confining structure in a direction transverse to a light propagation direction.

The second embodiment is different from the first embodiment in that the DFB laser region 120 is divided into plural current-injection regions under the three first electrodes 110-1, 110-2 and 110-3 and that the diffraction grating 106 is a uniform grating. In this embodiment, the coupling coefficient of the uniform grating 106 is set to 40 cm$^{-1}$, and its pitch is set to about 240 nm.

The operation of the second embodiment will be described. In this embodiment, when a current injected into the portion of the DFB laser region 120 directly adjacent to the phase adjusting region 121 is decreased, the influence of light returning from the phase adjusting region 121 is effectively imparted to the oscillation mode of the laser. Thus, the second embodiment can be operated similarly to the first embodiment, even though no diffraction gratings with different coupling coefficients are formed in the laser. If only such polarization switching operation is desired, the DFB laser region 120 only needs to be divided into two regions. However, since the DFB laser region 120 is divided into three regions in the second embodiment, the oscillation wavelength can also be readily controlled when amounts of currents injected into the two regions under the two electrodes 10-1 and 10-2 on the side of the antireflection layer 113 are varied, i.e., uneven current injection is performed.

Third Embodiment

Figure 5:
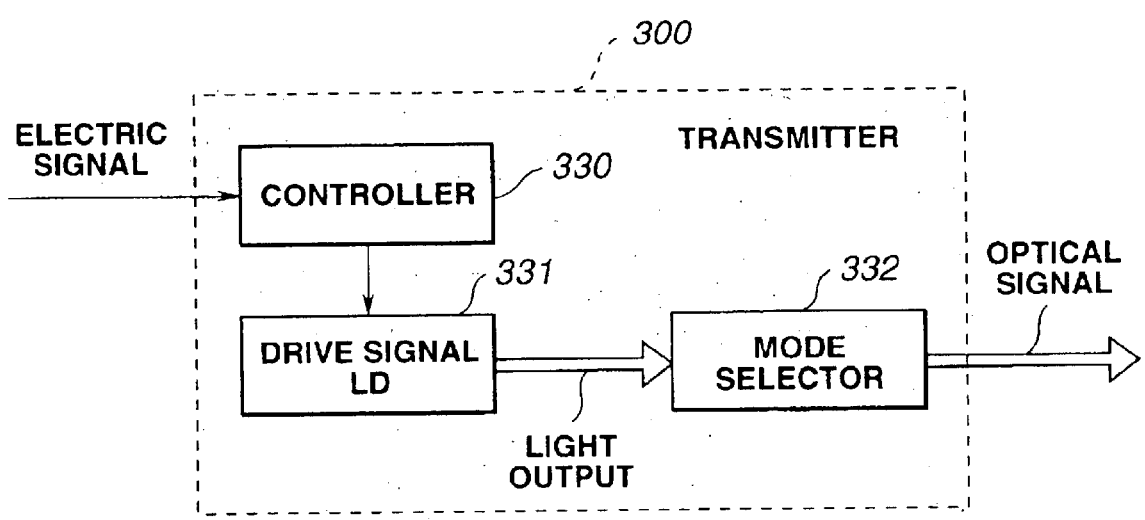
FIG. 5 is a block diagram illustrating a third embodiment of the present invention which is directed to a light transmitter with a laser of the present invention.

FIG. 5 illustrates a third embodiment of a light transmitter 300 using an optical device of the present invention. As illustrated in FIG. 5, the transmitter 300 includes a semiconductor laser (LD) 331 of the present invention, a mode selector 332, such as a polarization-mode selector (a polarizer), and a controller 330. Optical coupling means, such as lenses, may be employed to obtain effective optical couplings between the LD 31 and the mode selector 332 and the like.

The operation of the third embodiment will be described. The controller 330 receives a transmission electric signal and supplies a drive signal to the LD 331 so that the polarization mode (TE mode or TM mode) of output light from the device 331 is modulated corresponding to the electric signal. For that purpose, a current injected into the phase adjusting region of the above embodiment is changed, for example. The mode selector 332 selects one polarization mode from the light output generated by the drive signal. Thus, an intensity-modulated optical signal can be obtained corresponding to the transmission electric signal. The thus-constructed transmitter 300 can output the light intensity signal corresponding to the electric signal. Therefore, this transmitter can be used as a transmitter in an optical LAN or the like which performs communication using a light intensity signal.

The mode selector 332 may be a wavelength selector, such as an optical band-pass filter, when the wavelength of the output of the semiconductor laser 331 is switched simultaneously with the switching of the polarization mode.

The following wavelength multiplexing optical transmission system can also be constructed: A plurality of optical signals at plural wavelengths are supplied using a plurality of the above-described semiconductor lasers, plural optical signals are coupled to a single light transmission line, only a signal at a desired wavelength is selected in a receiver using a filter means, such as a tunable band-pass filter, and thus the desired signal is detected.

As described in the foregoing, according to the present invention, the construction is devised such that light from the phase controlling region is increased relative to light from the region adjacent to the phase controlling region, or the coupling coefficient of the region adjacent to the phase controlling region is decreased, thereby enhancing the effect of the phase controlling region.

Further, according to the present invention, the construction is devised such that the amount of current injected into the region adjacent to the phase controlling region can be decreased, thereby enhancing the effect of the phase controlling region without controlling the coupling coefficient of the diffraction grating along the cavity-axial direction.

Except as otherwise disclosed herein, the various components shown in outline or block form in the Figures are individually well known in the laser device and optical communication arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A laser comprising:
   a first region with a first waveguide, said first waveguide including a first diffraction grating;
   a second region with a second waveguide, said second waveguide including a second diffraction grating; and
   a phase controlling region with a third waveguide, said phase controlling region including control means for controlling an effective refractive index of said third waveguide, wherein said phase controlling region, said second region, and said first region are serially coupled in this order, and are constructed such that a coupling coefficient of said second region adjacent to said phase controlling region is smaller than a coupling coefficient of said first region, and said first and second diffraction gratings have a common value of pitch,
   wherein a reflective layer is provided on one end of said phase controlling region.

2. A laser according to claim 1, said phase controlling region, said first region, and said second region being constructed such that light to said second region from said phase controlling region is enlarged relatively to light to said phase controlling region from said second region.

3. A laser according to claim 1, said second region further including control means for pumping said second region, and said phase control means and said control means of said second region being capable of independently controlling said phase controlling region and said second region, respectively.

4. A laser according to claim 3, said phase control means and said control means of said second region being capable of independently injecting currents into said phase controlling region and said second region, respectively.

5. A laser according to claim 1, said first region further including first control means for pumping said first region, said second region further including second control means for pumping said second region, and said first control means and said second control means being constructed such that a pumping amount of said second region can be smaller than a pumping amount of said first region.

6. A laser according to claim 1, said laser being constructed as a distributed feedback semiconductor laser.

7. A laser according to claim 6, said first region further including an antireflection layer provided on a cleaved end facet of said first region.

8. A method for driving a laser, said method comprising the steps of:
   (A) preparing a laser including:
      (1) a first region with a first waveguide, said first waveguide including a first diffraction grating;
      (2) a second region with a second waveguide, said second waveguide including a second diffraction grating; and
      (3) a phase controlling region with a third waveguide, said phase controlling region including control means for controlling an effective refractive index of said third waveguide, wherein said phase controlling region, said second region, and said first region are serially coupled in this order, and are constructed such that a coupling coefficient of the diffraction grating of said second region adjacent to said phase controlling region is smaller than a coupling coefficient of the diffraction grating of said first region, and said first and second diffraction gratings have a common value of pitch,
      wherein a reflective layer is provided on one end of the phase controlling region; and (B) changing a current injected into or a reverse voltage applied to the phase controlling region to change at least one of a polarization mode and a wavelength of light output from the laser.

9. A light transmitter comprising:
(A) a laser including:
(1) a first region with a first waveguide, said first waveguide including a first diffraction grating;
(2) a second region with a second waveguide, said second waveguide including a second diffraction grating; and
(3) a phase controlling region with a third waveguide, said phase controlling region including control means for controlling an effective refractive index of said third waveguide, wherein said phase controlling region, said second region, and said first region are serially coupled in this order, and are constructed such that a coupling coefficient of the diffraction grating of said second region adjacent to said phase controlling region is smaller than a coupling coefficient of the diffraction grating of said first region, and said first and second diffraction gratings have a common value of pitch,
wherein a reflective layer is provided on one end of said phase controlling region;
(B) control means for controlling light output from said laser in accordance with a transmission signal; and
(C) a mode selector for selecting a component of a desired mode from the light output from said laser.

10. A light transmitter according to claim 9, said mode selector comprising a polarization-mode selector.

11. A light transmitter according to claim 9, said mode selector comprising a wavelength selector.

12. An optical communication system for communicating over a light transmission line that transmits a signal from a transmitter side to a receiver side, said system comprising:
(A) a light transmitter for transmitting light of a signal through the light transmission line including:
(1) a laser including:
(a) a first region with a first waveguide, said first waveguide including a first diffraction grating;
(b) a second region with a second waveguide, said second waveguide including a second diffraction grating; and
(c) a phase controlling region with a third waveguide, said phase controlling region including control means for controlling an effective refractive index of said third waveguide, wherein said phase controlling region, said second region, and said first region are serially coupled in this order, and are constructed such that a coupling coefficient of the diffraction grating of said second region adjacent to said phase controlling region is smaller than a coupling coefficient of the diffraction grating of said first region, and said first and second diffraction gratings have a common value of pitch,
wherein a reflective layer is provided on one end of the phase controlling region;
(2) control means for controlling light output from said laser in accordance with a transmission signal; and
(3) a mode selector for selecting a component of a desired mode from the light output from said laser; and
(B) a receiver for receiving and detecting an intensity-modulated signal transmitted from the laser through the light transmission line.

13. An optical communication system according to claim 12, said system being a wavelength division multiplexing optical communication system, in which the light transmission line transmits a plurality of intensity-modulated signals at a plurality of wavelengths generated by a plurality of said transmitters, and a wavelength selector selects the intensity-modulated signal at a desired wavelength to be detected on a side of said receiver.

* * * * *

UNITED STATES PATENT AND TRADEMARK OFFICE
CERTIFICATE OF CORRECTION

PATENT NO. : 6,807,201 B1
DATED : October 19, 2004
INVENTOR(S) : Jun Nitta

It is certified that error appears in the above-identified patent and that said Letters Patent is hereby corrected as shown below:

Column 2,
Line 43, "and" should be deleted; and
Line 44, "wave" should read -- with a second --.

Signed and Sealed this

Eighth Day of March, 2005

JON W. DUDAS
*Director of the United States Patent and Trademark Office*